United States Patent
Lee et al.

(10) Patent No.: US 9,291,513 B2
(45) Date of Patent: Mar. 22, 2016

(54) STRAIN SENSING DEVICE USING REDUCED GRAPHENE OXIDE AND METHOD OF MANUFACTURING THE SAME

(71) Applicant: Intellectual Discovery Co., Ltd., Seoul (KR)

(72) Inventors: Nae Eung Lee, Seoul (KR); Quang Trung Tran, Suwon-si (KR); Do Il Kim, Daegu (KR)

(73) Assignee: INTELLECTUAL DISCOVERY CO., LTD., Seoul (KR)

( * ) Notice: Subject to any disclaimer, the term of this patent is extended or adjusted under 35 U.S.C. 154(b) by 20 days.

(21) Appl. No.: 14/228,829

(22) Filed: Mar. 28, 2014

(65) Prior Publication Data

US 2014/0291733 A1    Oct. 2, 2014

(30) Foreign Application Priority Data

Mar. 28, 2013  (KR) .......................... 10-2013-0033909

(51) Int. Cl.
| | |
|---|---|
| H01L 29/84 | (2006.01) |
| H01L 29/66 | (2006.01) |
| H01L 21/3205 | (2006.01) |
| H01L 21/02 | (2006.01) |
| H01L 29/16 | (2006.01) |
| H01L 29/78 | (2006.01) |
| G01L 1/20 | (2006.01) |

(52) U.S. Cl.
CPC ............ *G01L 1/20* (2013.01); *H01L 29/66007* (2013.01); *H01L 29/78* (2013.01); *H01L 29/84* (2013.01)

(58) Field of Classification Search
CPC .......................... H01L 29/84; H01L 29/66007
See application file for complete search history.

(56) References Cited

U.S. PATENT DOCUMENTS

| | | | | |
|---|---|---|---|---|
| 2007/0048989 | A1* | 3/2007 | Ahn | ........................ C23C 16/40 438/591 |
| 2011/0284818 | A1* | 11/2011 | Avouris | ................. B82Y 10/00 257/9 |
| 2012/0161098 | A1* | 6/2012 | Hiura | .................. C23C 16/0218 257/9 |
| 2013/0040283 | A1* | 2/2013 | Star | ....................... G01N 27/127 435/5 |
| 2015/0060768 | A1* | 3/2015 | Dodabalapur | .... H01L 21/02425 257/29 |

FOREIGN PATENT DOCUMENTS

WO    WO 2013/015573    *    1/2013    ............ H01L 29/786

OTHER PUBLICATIONS

Machine translation of foreign patent document WO 2013/015573.*
Takao Someya et al., "Conformable, flexible, large-area networks of pressure and thermal sensors with organic transistor active matrixes" PNAS, vol. 102, No. 35, pp. 12321-12325, Aug. 30, 2005.

* cited by examiner

*Primary Examiner* — Howard Weiss
*Assistant Examiner* — Nelson Garces
(74) *Attorney, Agent, or Firm* — Rabin & Berdo, P.C.

(57) ABSTRACT

Provided is a strain sensing device using reduced graphene oxide (R-GO). The strain sensing device includes a flexible substrate, a gate electrode formed on the flexible substrate, a gate insulating layer configured to cover the gate electrode and include a part formed of a flexible material, an active layer formed of R-GO for sensing a strain, on the gate insulating layer, and a source and drain electrode formed on the active layer.

8 Claims, 14 Drawing Sheets

STRAIN SENSING DEVICE USING REDUCED GRAPHENE OXIDE AND METHOD OF MANUFACTURING THE SAME

CROSS-REFERENCE TO RELATED APPLICATIONS

This application claims priority under 35 U.S.C. §119 to Korean Patent Application No. 10-2013-0033909, filed on Mar. 28, 2013, the disclosure of which is incorporated herein by reference in its entirety.

TECHNICAL FIELD

The present invention relates to a strain sensing device using reduced graphene oxide and a method of manufacturing the same.

BACKGROUND

Very sensitive strain sensing devices are greatly needed for monitoring a state of a structure, such as an expressway, a building, a bridge, an airplane, a ship, or the like, or for early detecting a defect that occurs in an extreme situation such as a natural disaster such as earthquake, typhoon, or the like. Therefore, piezoelectric elements such as lead zirconate titanate (PZT), ZnO, and $ZnSnO_3$ are being researched.

However, most of piezoelectric elements are fragile ceramic materials, and are difficult to be used as a flexible strain sensor. A special manufacturing process is mainly needed for forming a piezoelectric element on a flexible substrate.

As a stimuli-responsive device, a touch sensor array in which a PVDF copolymer (a piezoelectric material) is used as a material of a sensor and a field-effect transistor (FET) is used as a signal converter is disclosed (Bauer et al., Appl. Phys. Lett. 2006, 89, 073501). In disclosed research, the touch sensor array operates in a scheme where a gate of an FET extends to thereby be connected to a piezoelectric element that is a sensor, and thus, the FET amplifies a signal at the same time with sensing.

Another research (Someya et al., PNAS, 102, 12321, 2005) discloses an array structure into which an OTFT-based pressure sensor using a piezoresistive electrode and a separate temperature sensor are integrated, and which simultaneously senses a temperature and a pressure.

However, when using a structure in which a sensor and an FET signal converter are split from each other, there are many problems such as a density of sensor pixels being limited, a manufacturing process being complicated, etc.

SUMMARY

Accordingly, the present invention provides a strain sensing device, which directly includes a stimuli-responsive material as an active layer of an FET, and a method of manufacturing the same.

In one general aspect, a strain sensing device includes: a flexible substrate; a gate electrode formed on the flexible substrate; a gate insulating layer configured to cover the gate electrode, and include a part formed of a flexible material; an active layer formed of reduced graphene oxide (R-GO) for sensing a strain, on the gate insulating layer; and a source and drain electrode formed on the active layer.

The gate insulating layer may include: a first gate insulating layer formed of oxide deposited by an atomic layer deposition (ALD) process, on the gate electrode; a second gate insulating layer formed of a flexible material, on the first gate insulating layer; and a third gate insulating layer formed of oxide deposited by the ALD process, on the second gate insulating layer.

The strain sensing device may further include a self-assembled monolayer (SAM) formed on the third gate insulating layer.

Graphene oxide formed by a graphite striping method may be adsorbed onto the SAM in a networked type, and by reducing the graphene oxide, the active layer may be formed.

The strain sensing device may further include an encapsulation layer formed of a hydrophobic material, and configured to at least cover the active layer.

In another general aspect, a method of manufacturing a strain sensing device includes: forming a gate electrode on a flexible substrate by using e-beam evaporation process using a shadow mask; forming a gate insulating layer including a flexible material on the gate electrode; forming an active layer on the gate insulating layer, the active layer being formed of reduced graphene oxide (R-GO) for sensing a strain; and forming a source and drain electrode on the active layer by using a thermal evaporation process using the shadow mask.

The forming of a gate insulating layer may include: depositing oxide on the gate electrode by using an atomic layer deposition (ALD) process to form a first gate insulating layer; spin-coating a polymer material on the first gate insulating layer to form a second gate insulating layer; and depositing oxide on the second gate insulating layer by using the ALD process to form a third gate insulating layer.

The method may further include, after the forming of a third gate insulating layer, forming a self-assembled monolayer (SAM) on the third gate insulating layer.

The forming of an active layer may include: adsorbing graphene oxide, formed by a graphite striping method, onto the SAM; and exposing the graphene oxide to hydrazine hydrate vapor to reduce the graphene oxide.

The method may further include, before the forming of a gate electrode, spin-coating a polymer material on the flexible substrate to form bare layer.

The method may further include, after the forming of a source and drain electrode, forming an encapsulation layer, which at least covers the active layer, by using a hydrophobic material.

The forming of an encapsulation layer may include: annealing all elements including the active layer; and forming the encapsulation layer to at least cover the active layer.

Other features and aspects will be apparent from the following detailed description, the drawings, and the claims.

DETAILED DESCRIPTION OF EMBODIMENTS

The advantages, features and aspects of the present invention will become apparent from the following description of the embodiments with reference to the accompanying drawings, which is set forth hereinafter. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

The terms used herein are for the purpose of describing particular embodiments only and are not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Hereinafter, a strain sensing device using R-GO and a method of manufacturing the same according to embodiments of the present invention will be described in detail with reference to the accompanying drawings.

Figure 1:
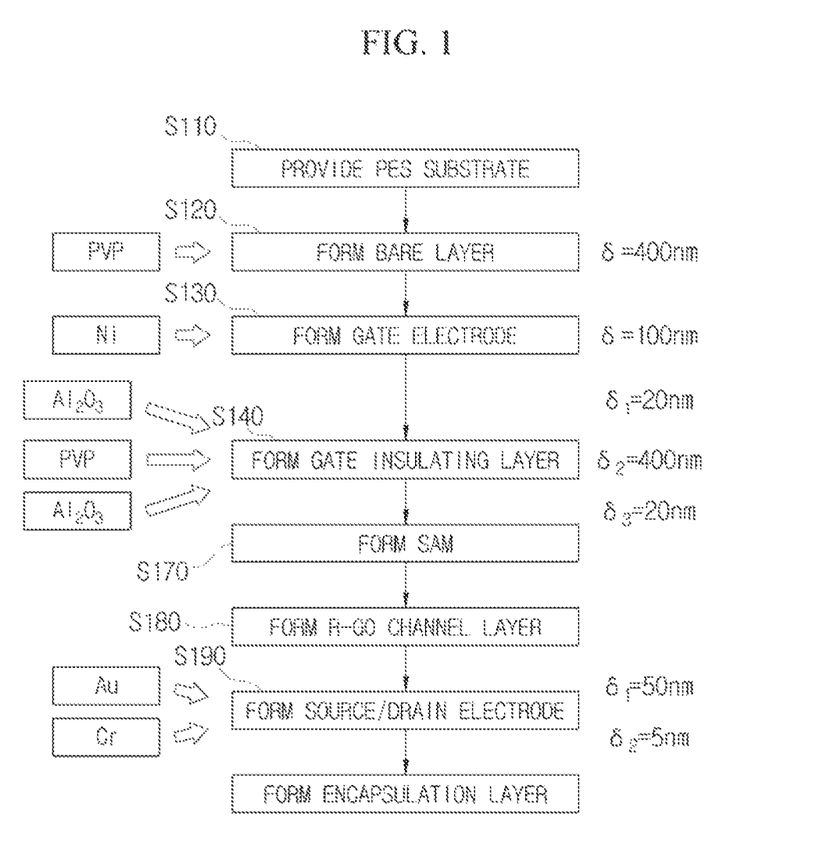
FIG. 1 is a flowchart illustrating a method of manufacturing an FET including a reduced graphene oxide (R-GO) active layer, according to an embodiment of the present invention.
Figure 2A:
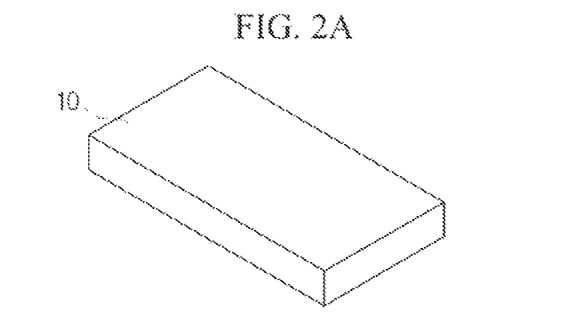
FIGS. 2A to 2J are cross-sectional views illustrating a process of manufacturing an R-GO FET, according to an embodiment of the present invention.
Figure 2B:
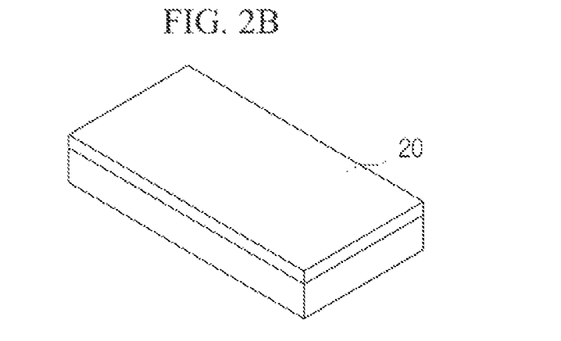
Figure 2C:
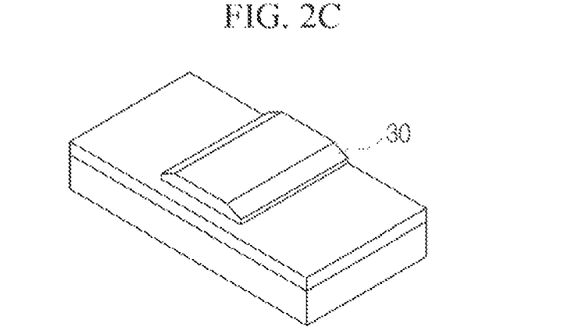
Figure 2D:
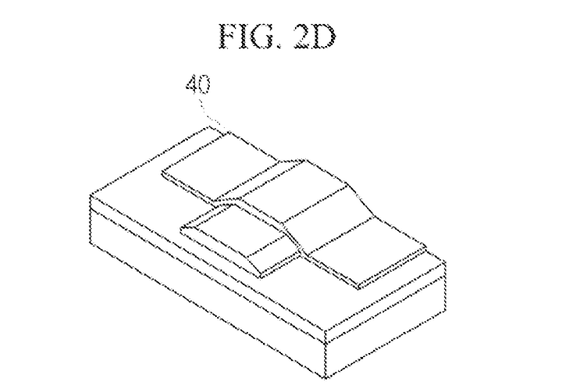
Figure 2E:
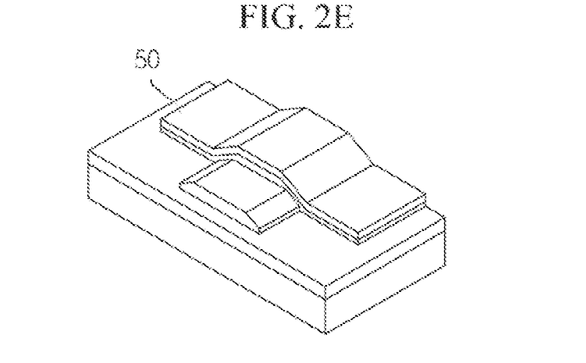
Figure 2F:
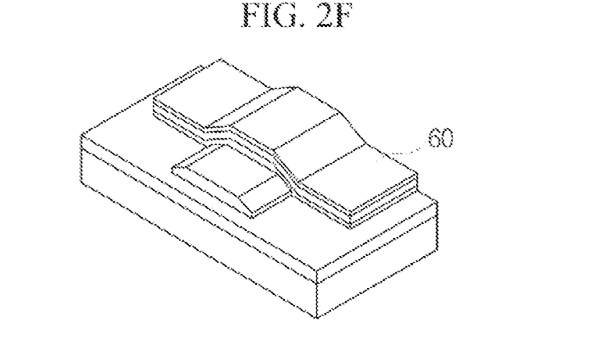
Figure 2G:
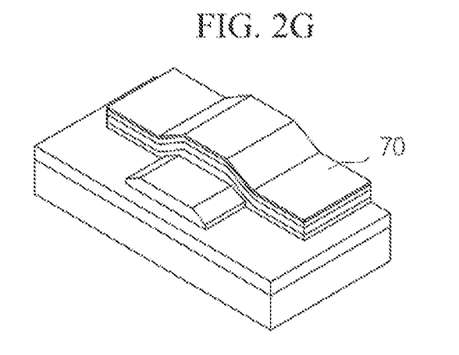
Figure 2H:
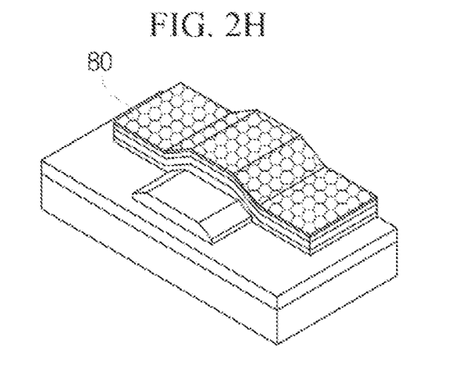
Figure 2I:
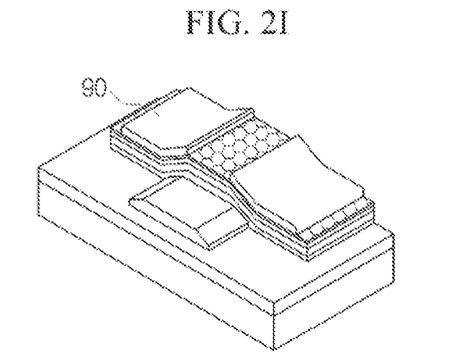
Figure 2J:
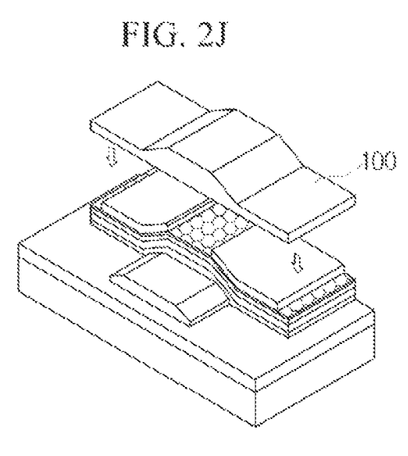

FIG. 1 is a flowchart illustrating a method of manufacturing an EFT including a reduced graphene oxide (R-GO) active layer, according to an embodiment of the present invention. FIGS. 2A to 2J are cross-sectional illustrating a process of manufacturing are R-GO FET, according to an embodiment of the present invention.

Referring to FIGS. 2A to 2J, The FET including the R-GO active layer according to an embodiment of the present invention includes a flexible polyethersulfone (PES) substrate 10, a bare layer 20 that is formed on the flexible PES substrate 10, a gate electrode 30 that is formed on the bare layer 20, a plurality of gate insulating layers 40, 50 and 60 that have a triple structure and cover the gate electrode 30, a self-assembled monolayer (SAM) 70 that is formed on the gate insulating layer 60, an active layer 80 that is formed of R-GO for sensing a strain and on the SAM 70, a source and drain electrode 90 that is formed on the active layer 80, and an encapsulation layer 100 that is formed on the source and drain electrode 90.

The R-GO FET, which is a strain sensing device according to an embodiment of the present invention, includes an active layer formed of networked R-GO nanosheet. Even when a love-level strain is applied due to slight coupling between adjacent nanosheets an inter-nanosheet resistance $R_{inter}$ is greatly changed, causing a great change in a transconductance of the R-GO FET. Therefore, a highly-sensitive strain sensing device for sensing a low-level strain of about 0.02% can be realized.

The R-GO FET is formed on a flexible substrate, and a gate insulating layer including a flexible material is formed in a triple structure for securing flexibility. The strain sensing device may be applied to flexible or elastic electronic devices.

Moreover, annealing of a device is performed in a vacuum state, and the device is capsulized by an encapsulation layer formed of an organic material, thereby obtaining high stability and reproducibility.

A method of manufacturing the R-GO FET according to an embodiment of the present invention will be described in detail.

As illustrated in FIG. 1 and FIGS. 2A to 2J, the PES substrate 10 is provided in operation S110. In operation S120, the bare layer 20 is formed by spin-coating poly-4-vinyl phenol (PVP) on the RES substrate 10 which is flexible and transparent. A thickness of the bare layer 20 is about 400 nm, for reducing a roughness of the PES substrate 10.

In this case, a material of the substrate 10 is not limited to PES, and a transparent and flexible substrate may be formed of another material. Also, the bare layer 20 may use various polymer materials in addition to PVP.

In operation S130, nickel (Ni) is deposited on the bare layer 20 by using an e-beam evaporation process using a shadow mask, thereby forming the gate electrode 30. Here, a thickness of the gate electrode 30 is about 100 nm.

The R-GO FET according to an embodiment of the present invention is formed on a flexible substrate so as to be applied to a flexible device, and for securing a flexibility of a device, a plurality of gate insulating layers are formed in a triple structure.

First, in operation S140, $Al_2O_3$ having a thickness of about 20 nm is deposited on the gate electrode 30 by using an atomic layer deposition (ALD) process, thereby forming a first gate insulating layer 40.

Subsequently, in operation S140, PVP having a thickness of about 400 nm is spin-coated on the first gate insulating layer 40, thereby forming a second gate insulating layer 50.

Moreover, in operation S140, $Al_2O_3$ having a thickness of about 20 nm is deposited on the second gate insulating layer 50 by using the ALD process, thereby forming a third gate insulating layer 60.

In this way, the first to third gate insulating layers 40, 50 and 60 are formed in a triple structure, thereby securing both insulation performance and flexibility.

In this case, materials of the first and third gate insulating layers 40 and 60 are not limited to aluminum oxide, and may use all oxides, which are deposited by a low-temperature ALD process, such as $HfO_2$ and $ZrO_2$. Also, the second gate insulating layer 50 may use another polymer material in addition to PVP.

Subsequently, in operation S170, the SAM 70 is formed of poly (diallyldimethylammonium chloride) (PDDA) on the third gate insulating layer 60. Therefore, a graphene oxide nanosheet is easily adsorbed onto an insulating layer, and thus, a thin and continuous graphene oxide network is formed.

Here, formation of the SAM 70 is not limited to a method of using PDDA, and the same result can be obtained even when the SAM 70 is formed of another amine group such as APTMS, APTES, or the like.

In operation S180, the active layer 80 formed of R-GO is formed on the SAM 70. In a method of forming the active layer 80, graphene oxide is adsorbed onto a gate insulating layer including an SAM strained by PDDA, by using a graphene oxide aqueous solution (0.2 mg/mL) of a graphene oxide nanosheet formed by a graphite striping method of Hummer. An adsorbed and networked graphene oxide layer is exposed to hydrazine hydrate vapor at about 40 degrees C. for 18 hours to thereby be reduced, thereby forming an R-GO layer 80 that is the active layer 80 of the FET.

The R-GO layer 80 acts as the active layer 80 of the FET, and moreover, since an electrical resistance is changed by a very low-level strain, the R-GO layer 80 may act as a strain sensing layer.

A change in an electrical conductivity of a networked R-GO thin film is caused when an intra-nanosheet resistance $R_{intra}$ and an inter-nanosheet resistance $R_{inter}$ are changed by a strain. The R-GO thin film has a high inter-nanosheet resistance due to slight coupling between adjacent nanosheets, and thus, even when a low-level strain is applied to the R-GO thin film, the inter-nanosheet resistance $R_{inter}$ is greatly changed, causing a great change in a transconductance of the R-GO FET.

A strain sensing performance of the R-GO FET will be described below.

After the active layer 80 is formed, the source and drain electrode 90 is formed by thermally evaporating gold (Au) to a thickness of about 50 nm and chromium (Cr) to a thickness of about 5 nm by using a shadow mask, in operation S190.

In a sensor using a stimuli-responsive FET, an electrical stability of a device is very important, but a defect and disorder of an R-GO thin film configuring an active layer of an FET causes hysteresis because being very sensitive to an ambient environment.

To solve such a problem, in the FET including the R-GO active layer according to an embodiment of the present invention, the encapsulation layer 100 is formed on a finished FET in operation S200.

The encapsulation layer 100 is formed of tetratetracontane (TTC, $CH_3(CH_2)_{42}CH_3$). The encapsulation layer 100 improves a performance of the R-GO FET, and removes electrical instability that is caused because the R-GO active layer adsorbs ambient oxygen or moisture.

That is, the R-GO FET formed through operations S110 to S190 are annealed for 3 hours under a high vacuum state of about $10^{-5}$ Torr and a temperature of about 150 degrees C. to remove adsorbed molecules, and the encapsulation layer 100 covers the R-GO FET. A TTC layer having high hydrophobicity minimizes adsorption of a polar solvent such as vapor, thereby protecting the active layer of the R-GO FET.

According to an embodiment of the present invention, sixteen the R-GO FETs may be manufactured in a region of 193 mm² by the above-described method of manufacturing the R-GO FET.

Figure 3A:
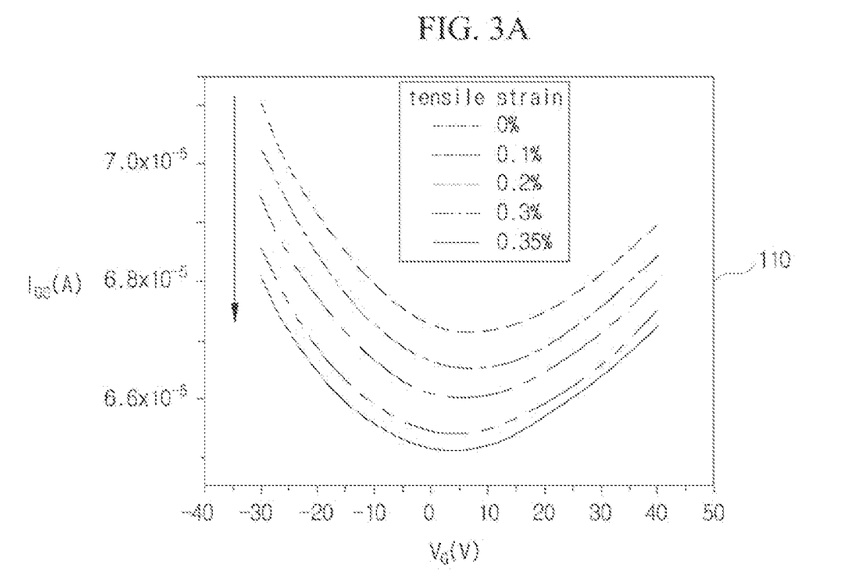
FIGS. 3A and 3B show a transfer characteristic of the R-GO FET according to an embodiment of the present invention with respect to a tensile strain and compressive strain of 0.1% to 0.35%.
Figure 3B:
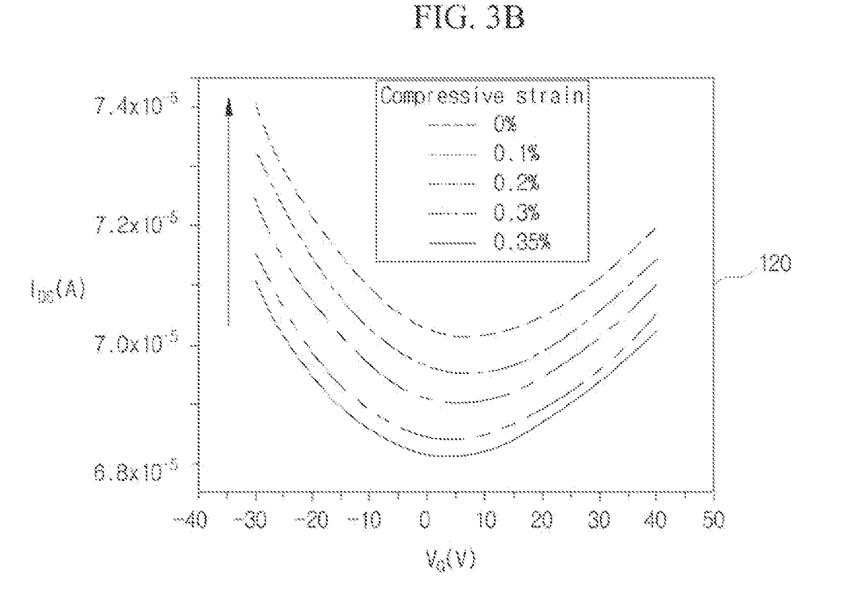

FIGS. 3A and 3B show a transfer characteristic of the R-GO FET according to an embodiment of the present invention with respect to a tensile strain and compressive strain of 0.1% to 0.35%, and shows a result that is obtained by changing a voltage $V_G$ to measure a current $I_{DS}$ in a state of maintaining a source-drain voltage $V_{DS}$ as about 3 V.

As shown in FIG. 3A, when tensile strain s applied, the current $I_{DS}$ decreases. As shown in FIG. 3B, when a compressive strain is applied, the current $I_{DS}$ increases.

Figure 4:
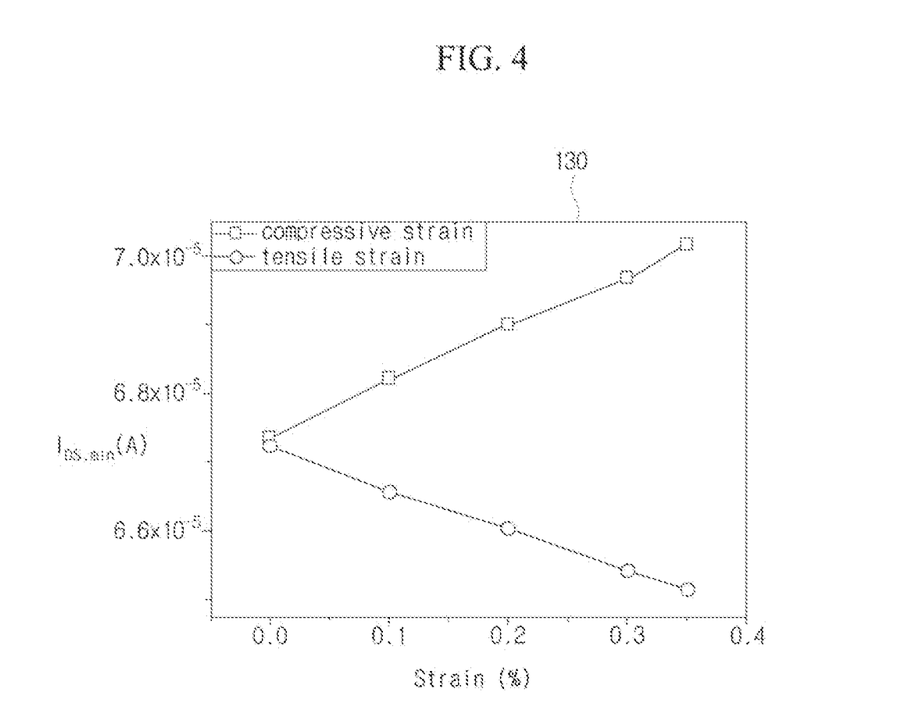
FIG. 4 shows, as a function of a measured tensile strain and compressive strain, the minimum source-drain current at a charge neutrality point (CNP) of transfer curves of FIGS. 3A and 3B.

FIG. 4 shows, as a function of a measured tensile strain and compressive strain, the minimum source-drain current $I_{DS,min}$ at a charge neutrality point (CNP) of transfer curves of FIGS. 3A and 3B.

A current $I_{DS,min}$ response to the tensile strain is opposite to a current $I_{DS,min}$ response to the compressive strain. In detail, when the compressive strain increases, the current $I_{DS,min}$ increases, and when the tensile strain is applied, the current $I_{DS,min}$ decreases.

To describe a strain sensing mechanism of the R-GO FET, a resistance of an R-GO channel is changed by a strain to cause a change in the current $I_{DS}$ of a device. An inter-nanosheet resistance $R_{inter}$ of a networked R-GO thin film is changed when charge-hopping transport based on coupling of a nanosheet junction and carrier mobility are changed. A change amount of the inter-nanosheet resistance can greatly increase due to an applied strain. The tensile strain reduces the coupling of the nanosheet junction, and increases an inter-nanosheet resistance of the networked R-GO thin film, causing a reduction in the current $I_{DS}$. On the other hand, the current $I_{DS}$ increases when the compressive strain increases, and thus, the coupling of the nanosheet junction is reinforced by the compressive strain, causing a reduction in the resistance of the R-GO channel.

Figure 5:
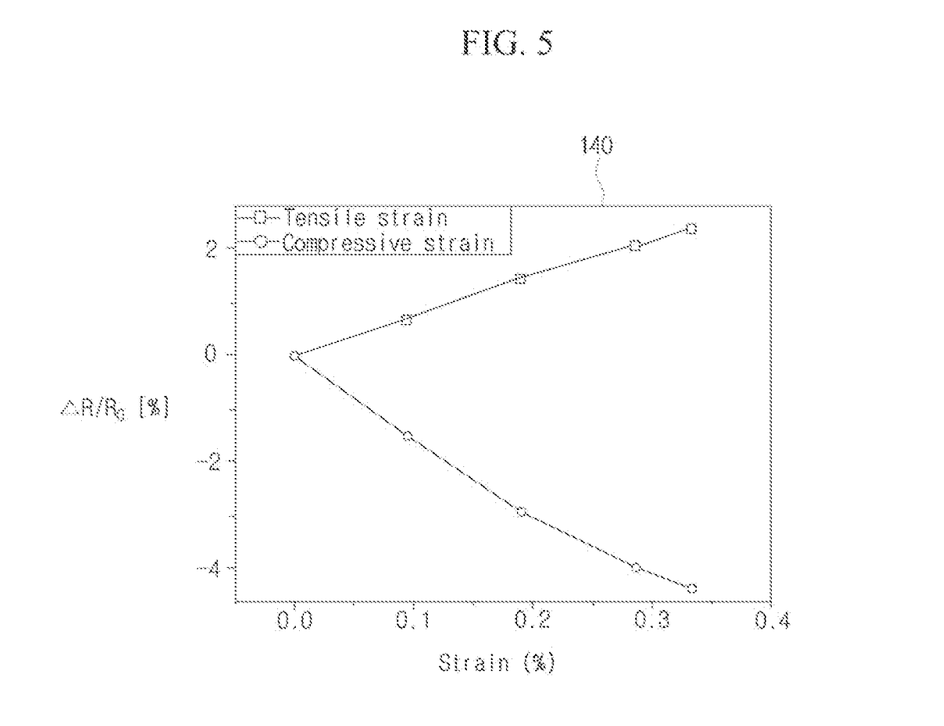
FIG. 5 shows a resistance of an R-GO thin film obtained from a current $I_{DS}$ which is measured when a gate voltage is not applied.

FIG. 5 shows a resistance of an R-GO thin film obtained from a current $I_{DS}$ Which is measured when a gate voltage is not applied, and is for clarifying that a current $I_{DS}$ change due to the tensile or compressive strain is caused by coupling between adjacent nanosheets instead of interference by a capacitance of the gate insulating layer.

A result shown in FIG. 5 shows that the current $I_{DS}$ change due to the tensile or compressive strain is caused by a resistance change of the R-GO channel.

Figure 6:
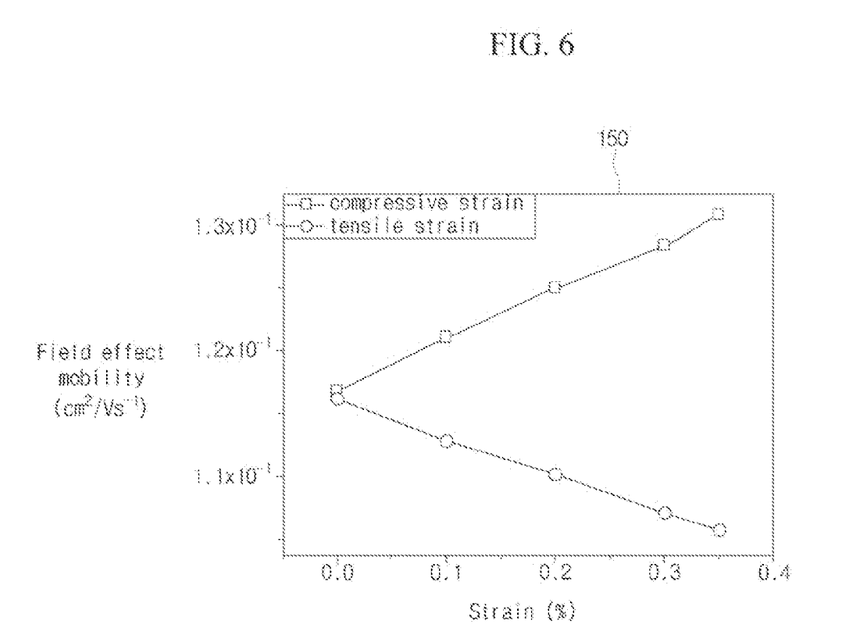
FIG. 6 shows a change in field-effect mobility due to a tensile strain and a compressive strain.

FIG. 6 shows a change in field-effect mobility due to the tensile strain and the compressive strain.

Field-effect mobility $\mu_{FE}$ is extracted from a transfer characteristic of the R-GO FET, for clarifying influences of the tensile and compressive strains on a channel resistance change of the R-GO FET along with a strain sensing mechanism of a device.

An influence of a potential barrier (PB) on a field-effect mobility $\mu_{FE}$ of the R-GO channel has been studied for understanding a field-effect mobility $\mu_{FE}$ change direction of the R-GO FET with the tensile or compressive strain applied thereto. A PB size between a nanoparticle (which affects hopping transport or carrier mobility) and a separate component of a nanowire is dependent on coupling between separate components. Similarly, a coupling condition between adjacent two-dimensional (2D) R-GO nanosheets in a channel affects a degree of overlap or a gap between R-GO nanosheets in the nanosheet junction, and allows a junction region and a PB size to be determined. The junction region and the PB size affects carrier-hopping transport and the field-effect mobility $\mu_{FE}$ of the R-GO FET, causing a change in each of the field-effect mobility $\mu_{FE}$ and the inter-nanosheet resistance $R_{inter}$. Under the tensile strain, the junction region decreases, a large gap of the networked R-GO thin film limits movement of carriers, scattering increases to cause a reduction in the field-effect mobility $\mu_{FE}$, thereby increasing the inter-nanosheet resistance $R_{inter}$ of the R-GO channel. On the other hand, an increase in the field-effect mobility $\mu_{FE}$ and a decrease in the inter-nanosheet resistance $R_{inter}$ due to the compressive strain are caused by a reduction in the PB size, and as the junction region in the nanosheet junction increases, carrier scattering decreases, and hopping transport increases.

Figure 7:
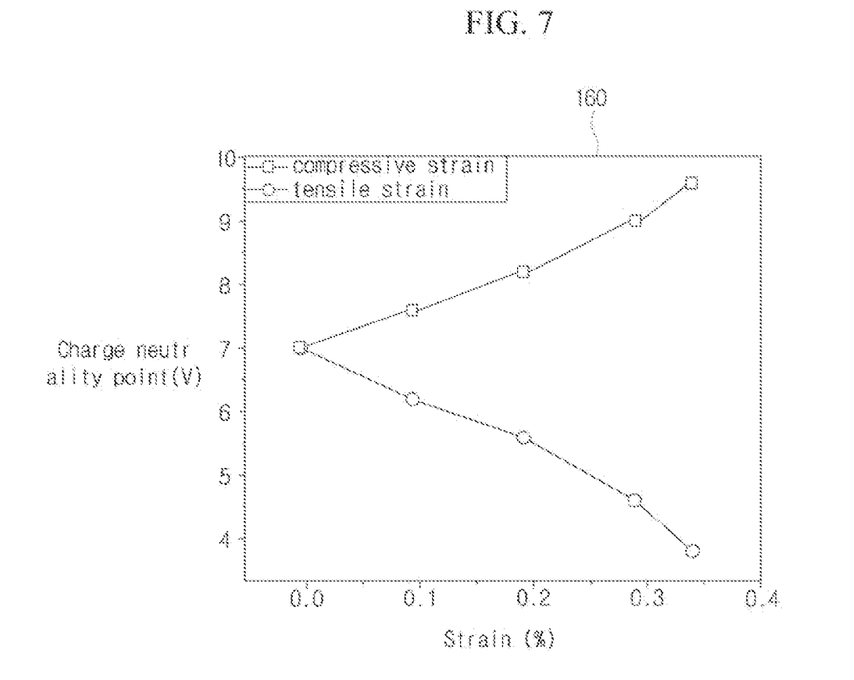
FIG. 7 shows, as a function of a tensile strain and compressive strain, CNP movement of an R-GO FET according to an embodiment of the present invention.

FIG. 7 shows, as a function of the tensile strain and compressive strain, CNP movement of the R-GO FET according to an embodiment of the present invention.

A gate capacitance decreases under the compressive strain, and under the tensile strain, the gate capacitance increases. A capacitance change is caused by a change in a thickness of an insulation layer based on a Poisson effect. Therefore, a CNP change caused by the tensile and compressive strains may be predicted by a capacitance change of the gate insulating layer.

Figure 8A:
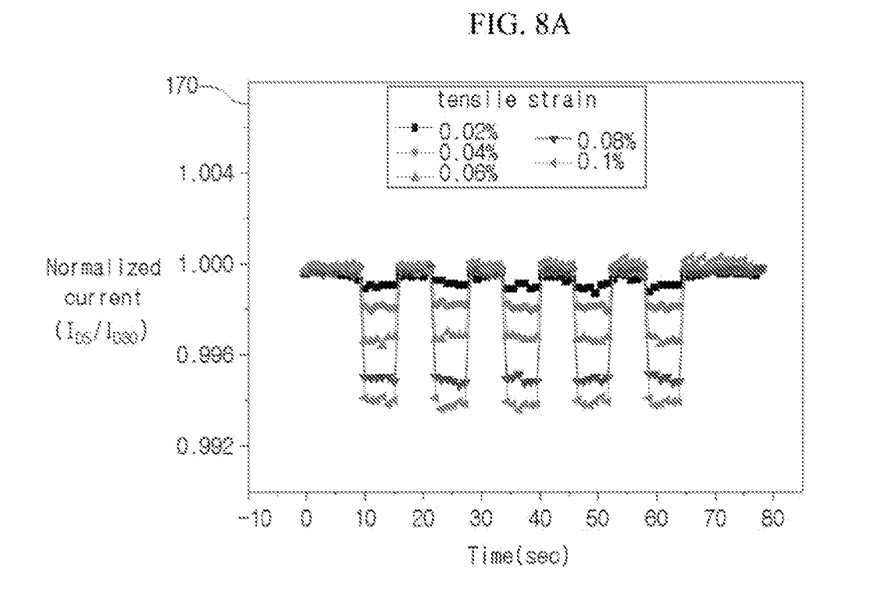
FIGS. 8A and 8B show sensing characteristics measured under a repeated strain condition.
Figure 8B:
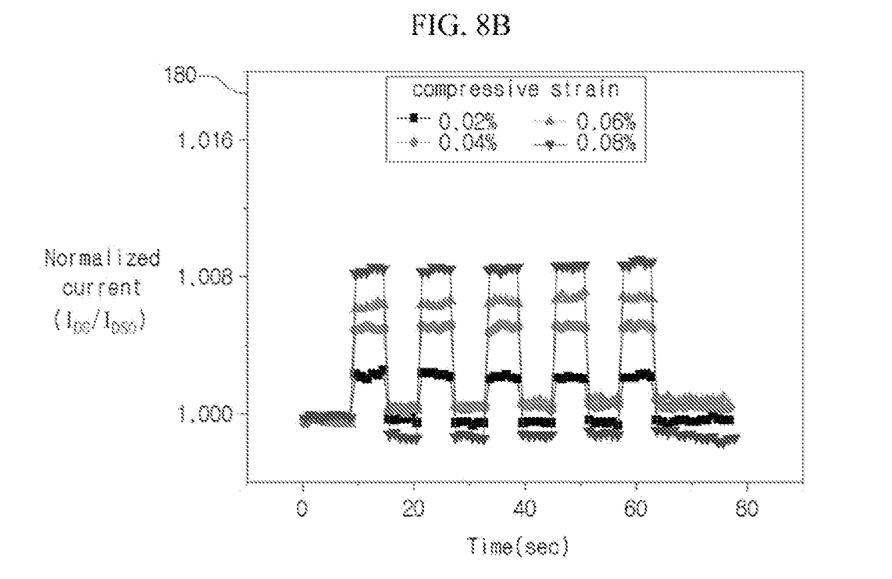

FIGS. 8A and 8B show sensing characteristics measured under a repeated strain condition, and shows results that are obtained by measuring the current $I_{DS}$ with time with respect to various tensile stains (FIG. 8A) and compressive strains (FIG. 8B).

As shown in FIGS. 8A and 8B, a normalized current "$I_{DS}/I_{DS0}$ ($I_{DS}$: a current under a strain, and $I_{DS0}$: a current when there is no strain)" shows time dependence on very small tensile and compressive strains of about 0.02% to about 0.08%. Such a result shows that the R-GO FET according to the present invention may be used as a highly-sensitive strain sensor for sensing small tensile and compressive strains of about 0.02%.

Figure 9A:
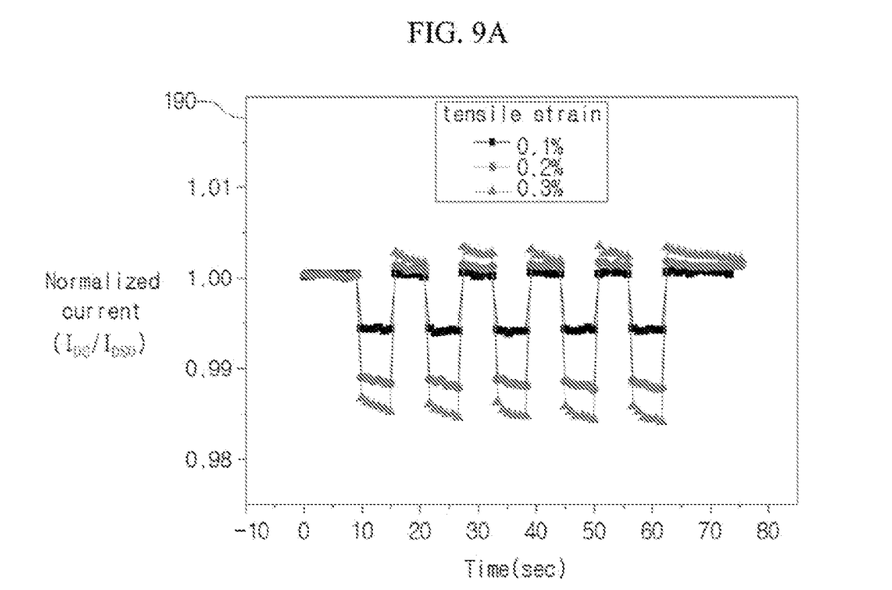
FIGS. 9A and 9B show a time dependence of $I_{DS}/I_{DS0}$ of the R-GO FET according to an embodiment of the present invention with respect to a tensile strain and compressive strain of 0.1% to 0.3%.
Figure 9B:
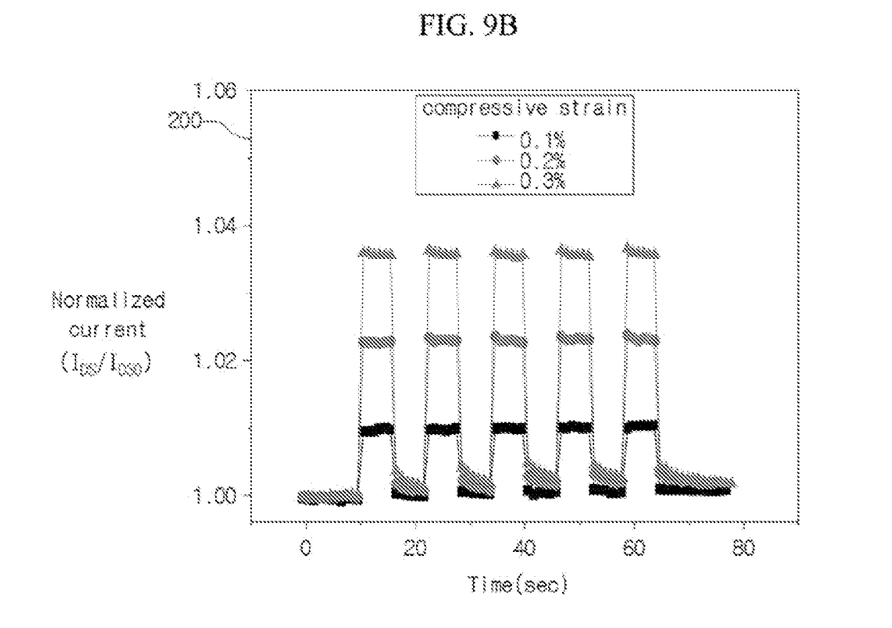

FIGS. 9A and 9B show a time dependence of the normalized current "$I_{DS}/I_{DS0}$" of the R-GO FET according to an embodiment of the present invention with respect to a tensile strain (FIG. 9A) and compressive strain (FIG. 9B) of about 0.1% to about 0.3%.

In this case, FIGS. 9A and 9B show that a time taken in applying and releasing a strain is one second, and a response and relaxation time of a device is one second, and shows performances in which the R-GO FET according to an embodiment of the present invention dynamically responds and relaxes to the tensile and compressive strain.

Figure 10A:
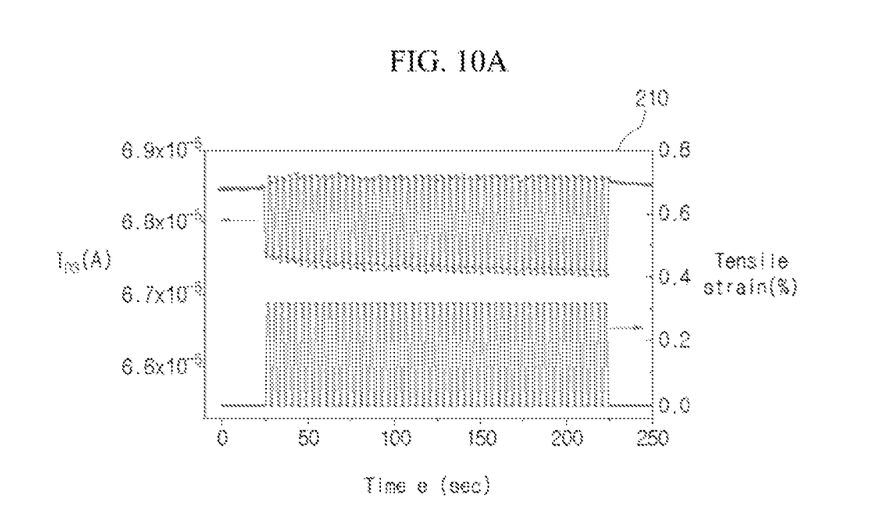
FIGS. 10A and 10B show sensing performance when strain is dynamically applied under an ambient condition.
Figure 10B:
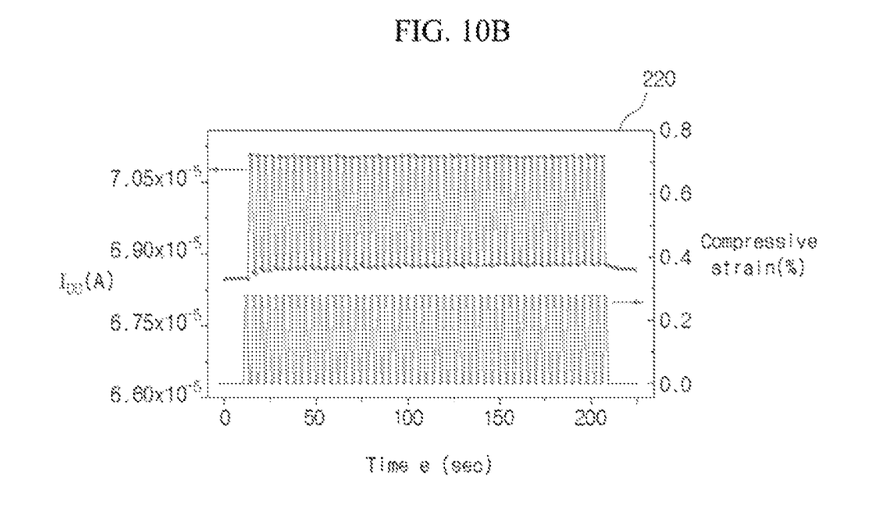

FIGS. 10A and 10B shows sensing performance when strain is dynamically applied under an ambient condition, and show results that are obtained by evaluating stability and repeatability for evaluating a reliability of a strain response of the R-GO FET according to an embodiment of the present invention.

FIGS. 10A and 10B show results that are obtained by monitoring the current $I_{DS}$ with time in response to 50 cycles in which the tensile strain (FIG. 10A) and the compressive strain (FIG. 10B) are applied.

Here, the tensile and compressive strains maintain about 0.3%, an interval between an application and release of a strain is about two seconds for each cycle, and a time taken until the tensile and compressive strains reach about 0.3% is one second. Except a slight change in each of sensitivity and a base current, the R-GO FET according to an embodiment of the present invention shows good repeatability a current response and relaxation time during a tensile and compressive strain cycle. Based on such a result, it can be seen that the R-GO FET according to an embodiment of the present invention is very stable in repetitive response to dynamic tensile and compressive strains even after a repetitive mechanical strain.

FIGS. 11A to 11D show sensing performance, repeatability, a response time, and a relaxation time, which are measured after a device is periodically bent.

Figure 11A:
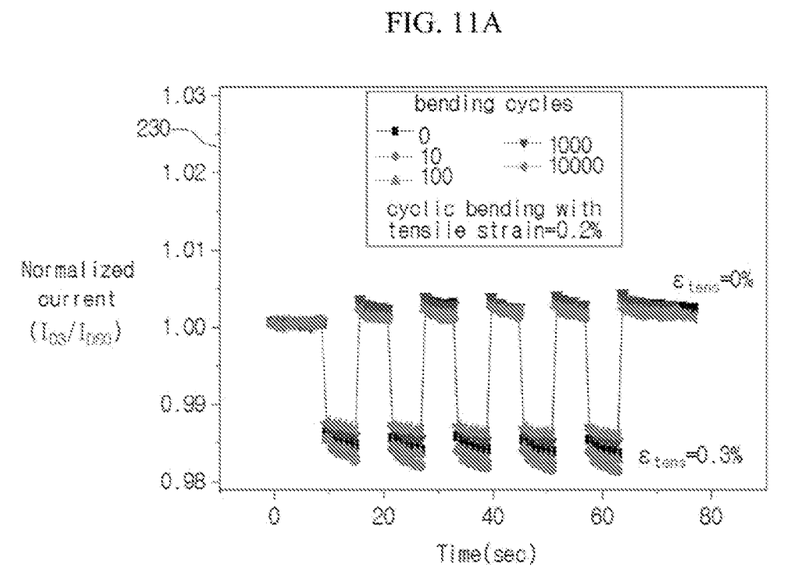
FIGS. 11A to 11D show sensing performance, repeatability, a response time, and a relaxation time, which are measured after a device is periodically bent.
Figure 11B:
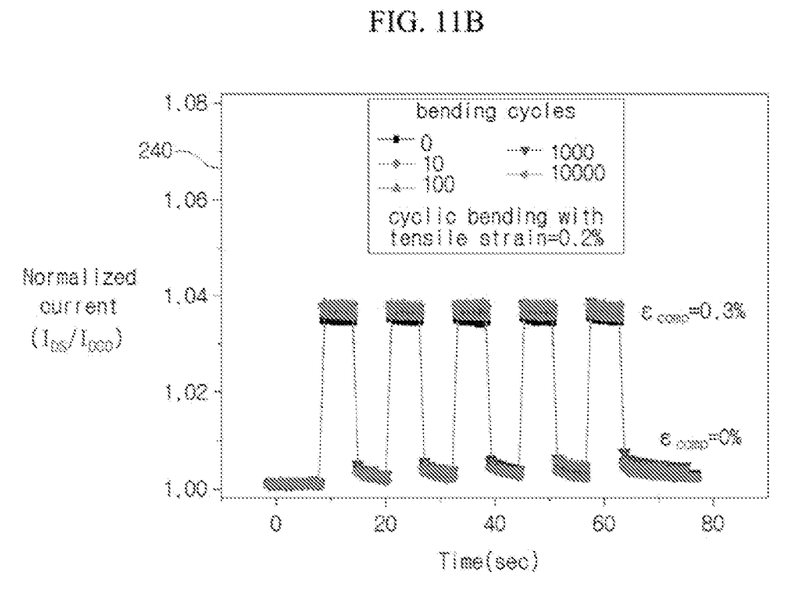

FIGS. 11A and 11B show changes in the normalized current "$I_{DS}/I_{DS0}$" due to the tensile and compressive strains after a device is periodically bent at a strain of about 0.2% during bending cycles "10, 100, 1,000, and 10,000". A stable current "$I_{DS}/I_{DS0}$" response to the tensile and compressive strains after periodic bending shows that the R-GO FET according to an embodiment of the present invention has high repeatability in sensing performance including a current response, a response time, and a relaxation time.

Figure 11C:
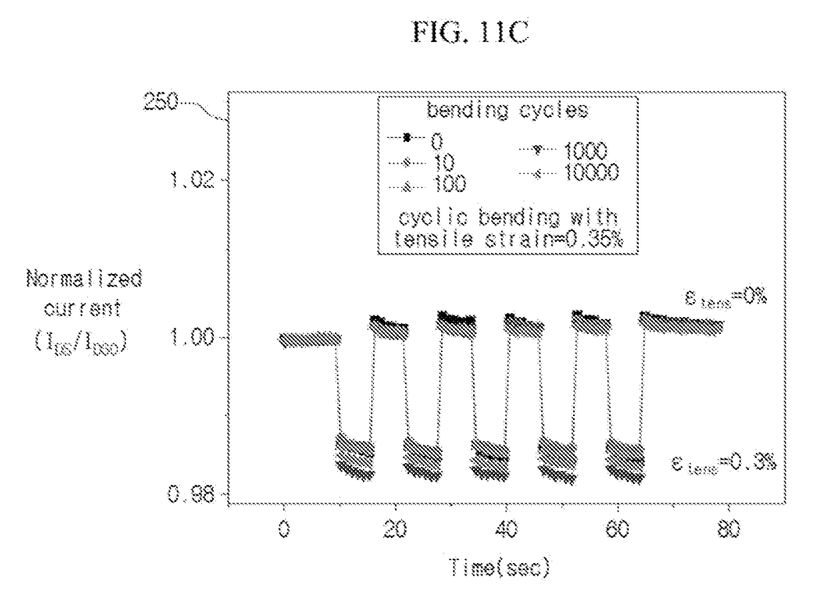
Figure 11D:
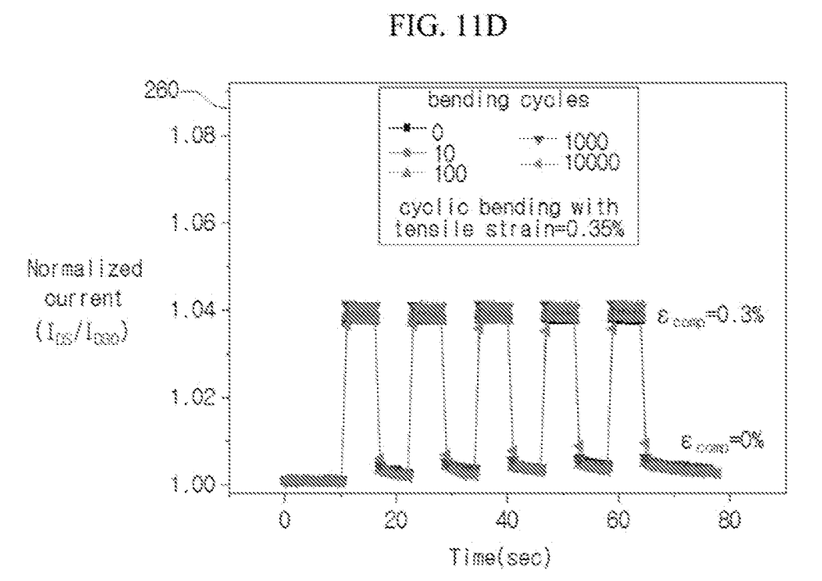

FIGS. 11C and 11D show that sensing performance, a repeatability of a normalized current, a response time, and a relaxation time are hardly changed even after a device is periodically bent at a higher strain of about 0.35%. After a bending cycle "10,000", the current $I_{DS}$ increases, but the sensing performance, the repeatability of the current, the response time, and the relaxation time are not changed.

Figure 12A:
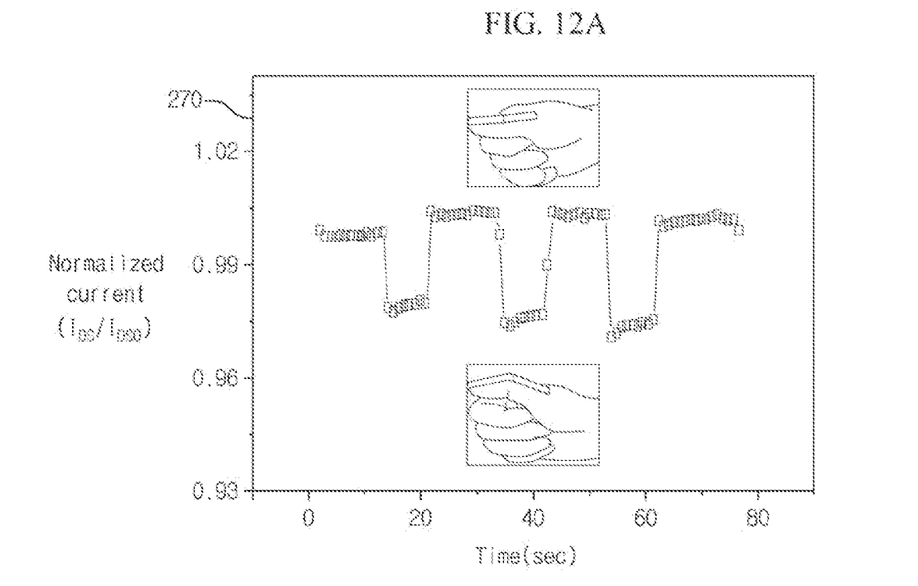
FIGS. 12A and 12B show performances (which are measured with respect to motions of a human body) of an R-GO FET strain sensing device according to an embodiment of the present invention.
Figure 12B:
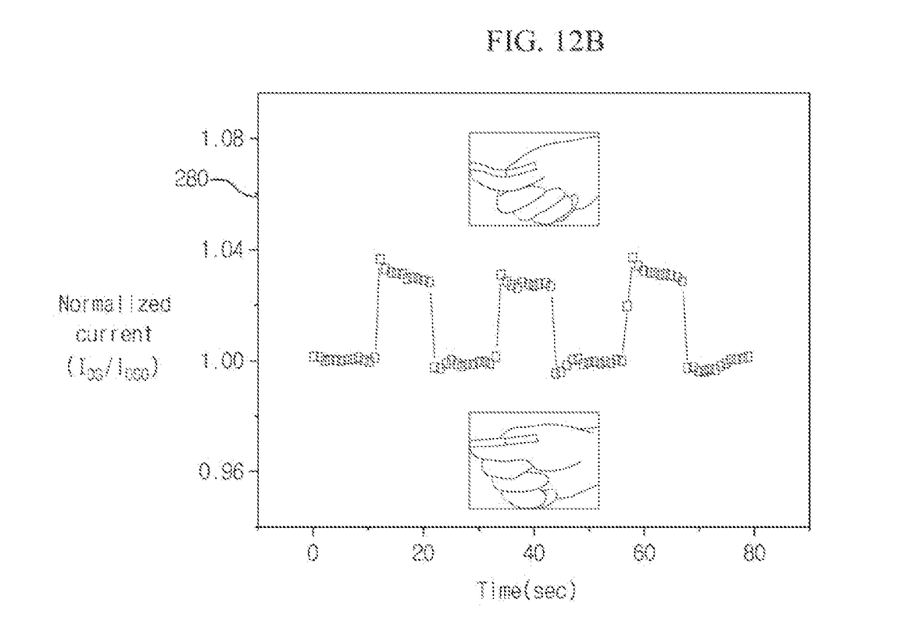

FIGS. 12A and 12B show performances (which re measured with respect to motions of a human body) of the R-GO FET strain sensing device according to an embodiment of the present invention, for showing a possibility that the R-GO FET strain sensing device according to an embodiment of the present invention is applied to various application fields such as health state monitoring, smart surgical gloves, human-machine interfaces, etc. To this end, a PES substrate with the R-GO FET strain sensing device provided thereon is attached to a thumb.

FIGS. 12A and 12B show results that are obtained by recording a current $I_{DS}$ response to a motion of bending a finger under conditions "$V_{DS}$=3V and $V_G$–5V". The current $I_{DS}$ decrease and increase quickly. This matches a response of a device to the tensile and compressive stains based on a motion (see FIG. 12A) of and bending a thumb and a motion (see FIG. 12B) of downward bending the thumb. Also, the current $I_{DS}$ is recovered to the original current value after a motion cycle of bending and relaxing a finger.

According to the present invention, provided can be a highly-sensitive FET sensor for sensing a tensile strain and compressive strain of 0.02% and a method of manufacturing the same.

The strain sensing device according to the present invention can be manufactured at a high density on a flexible substrate by using a general process, and can be easily applied to a flexible or elastic electronic device due to a flexibility of a device itself. Accordingly, a product that is very stable and reliable in mechanism can be produced. Also, the encapsulation layer protects the active layer from an ambient environment, thereby ensuring a stability of a device.

The strain sensing device according to the present invention has good sensing performance, stability, reproducibility, and response. Therefore, the strain sensing device can be stably maintained even after a mechanical strain in which a relaxation time is repeated, and can accurately and quickly sense a small and fast motion of a human body.

A number of exemplary embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:
1. A strain sensing device comprising:
a flexible substrate;
a gate electrode formed on the flexible substrate;
a gate insulating layer configured to cover the gate electrode, and include a part formed of a flexible material, the gate insulating layer including:
a first gate insulating layer formed of oxide deposited by an atomic layer deposition (ALD) process, on the gate electrode;

a second gate insulating layer formed of a flexible material, on the first gate insulating layer; and a third gate insulating layer formed of oxide deposited by the ALD process, on the second gate insulating layer;

an active layer formed of reduced graphene oxide (R-GO) for sensing a strain, on the gate insulating layer;

a source and drain electrode formed on the active layer; and a self-assembled monolayer (SAM) formed on the third gate insulating layer.

2. The strain sensing device of claim 1, wherein graphene oxide formed by a graphite striping method is adsorbed onto the SAM in a networked type, and by reducing the graphene oxide, the active layer is formed.

3. The strain sensing device of claim 1, further comprising an encapsulation layer formed of a hydrophobic material, and configured to at least cover the active layer.

4. The strain sensing device of claim 1, further comprising a bare layer formed on the flexible substrate, wherein the gate electrode is formed on the bare layer.

5. The strain sensing device of claim 1, wherein the first and third gate insulating layers are formed of aluminum oxide.

6. The strain sensing device of claim 1, wherein the first and third gate insulating layers are formed of $HfO_2$.

7. The strain sensing device of claim 1, wherein the first and third gate insulating layers are formed of $ZrO_2$.

8. The strain sensing device of claim 1, wherein the second gate insulating layers is formed of poly-4-vinyl phenol (PVP).

* * * * *